(12) United States Patent
Lin et al.

(10) Patent No.: US 8,073,644 B2
(45) Date of Patent: Dec. 6, 2011

(54) AUTOMATIC VOLTAGE-IDENTIFYING POWER SUPPLY DEVICE AND METHOD THEREOF

(76) Inventors: Hui-Fan Lin, Taichung (TW);
Fu-Chang Chen, Heping Township, Taichung County (TW)

(*) Notice: Subject to any disclaimer, the term of this patent is extended or adjusted under 35 U.S.C. 154(b) by 217 days.

(21) Appl. No.: 12/651,934

(22) Filed: Jan. 4, 2010

(65) Prior Publication Data
US 2010/0176778 A1 Jul. 15, 2010

(30) Foreign Application Priority Data
Jan. 10, 2009 (TW) ................................ 98100838 A (51) Int. Cl.
*G01R 19/00* (2006.01)

(52) U.S. Cl. .......................................................... 702/64

(58) Field of Classification Search .................... 702/64; 324/76.11
See application file for complete search history.

(56) References Cited

U.S. PATENT DOCUMENTS
7,449,875 B2 * 11/2008 Chang ........................ 324/76.11
2006/0152872 A1 * 7/2006 Lin .................................. 361/78
* cited by examiner

*Primary Examiner* — Aditya Bhat
(74) *Attorney, Agent, or Firm* — patenttm.us (57) ABSTRACT

An automatic voltage-identifying power supply device has a control module, a voltage regulation circuit, a current load measuring circuit electrically connected with an external post-stage power-receiving device, a power supply circuit and a pre-stage power supply device. After the post-stage power-receiving device is electrically connected with the current load measuring circuit, the control module can control the voltage regulation circuit to output a test voltage signal to the post-stage power-receiving device so that the test voltage signal is altered according to a preset sequence (e.g. progressively increasing) and the current load measuring circuit measures a response current signal of the post-stage power-receiving device corresponding to the test voltage signal. When a variation of the response current signal or a power variation is stable, the control module sets up the stable test voltage signal as an input voltage to the post-stage power-receiving device.

24 Claims, 9 Drawing Sheets

AUTOMATIC VOLTAGE-IDENTIFYING POWER SUPPLY DEVICE AND METHOD THEREOF

BACKGROUND OF THE INVENTION

1. Field of the Invention

The present invention is related to an automatic voltage-identifying power supply device and method thereof, and more particularly to an automatic voltage-identifying power supply device and method thereof capable of connecting with different post-stage power-receiving equipment.

2. Description of the Related Art

Electronic products have become an indispensable part to daily life of human being. Accompanying with development of technologies, a wide range of electronic products have flooded to the market. Despite more convenient and brilliant life attributable to various functions brought along by electronic products, too many choices of electronic products also make the management of normal life uneasy and more and more complicated.

For example, what electronic products a business person carries may include MP3, PDA, GPS, notebook computer, mobile phone and the like. Due to different rated operating voltages, electronic products must be equipped with a specific pre-stage power supply device or a battery charger transformer. Usually, pre-stage power supply devices are rather heavy and bulky. To prevent electronic devices from exhausting all the power unexpectedly, various pre-stage power supply devices for different electronic products should be close at hand to the business person, inevitably becoming the burden in operation and management.

SUMMARY OF THE INVENTION

An objective of the present invention is to provide an automatic voltage-identifying power supply method automatically detecting a rated operating voltage of the electronic product and outputting a required voltage and current to the electronic product.

To achieve the foregoing objective, the automatic voltage-identifying power supply method has steps of:

a wait process determining if a post-stage power-receiving device is connected therewith, and continuously executing the wait process if the post-stage power supply device is not connected or performing a next step;

a measurement process having a step of outputting a test voltage signal to the post-stage power-receiving device and continuously measuring a response current signal fed back from the post-stage power-receiving device; and a step of determining if the post-stage power-receiving device reaches a stable power consumption variation corresponding to the test voltage signal or a stable current consumption variation corresponding to the response current signal, wherein if the determination result is negative, continuously outputs a relatively larger test voltage signal to the post-stage power-receiving device, measures a corresponding response current signal and determines again if the post-stage power-receiving device reaches a stable power consumption variation or a stable current consumption variation; and if the determination result is positive, perform a next step;

a supplying power process obtaining an input voltage signal from a pre-stage power supply device, letting the test voltage signal reaching a stable power consumption variation or a stable current consumption variation be a rated voltage to continuously output the rated voltage to the post-stage power-receiving device, continuously determining if the post-stage power-receiving device is electrically disconnected, and if the determination result is negative, continuously executing the step, and if the determination result is positive, executing a next step; and a step of terminating to output power to the post-stage power-receiving device and returning to the wait process.

Preferably, the automatic voltage-identifying power supply method further comprises an overload determination and protection process of the pre-stage power supply device performed after the determination result of the post-stage power-receiving device reaching a stable power consumption variation or a stable current consumption variation is positive and the determination result of the supplying power process is negative and having a step of determining if the outputted power by the pre-stage power supply device is below a specific ratio of a rated input power value of the pre-stage power supply device, wherein if the determination result is positive, terminate to output voltage and current from the pre-stage power supply device; and if the determination result is negative, continuously receive the output voltage of the pre-stage power supply device and then exit the overload determination and protection process of the pre-stage power supply device.

Preferably, the automatic voltage-identifying power supply method further comprises a step of delaying a time executed after the step of terminating to output voltage and current and returning to the wait process after executing the step.

Preferably, the test voltage signal is a series of square waves having progressively increasing voltage values.

Preferably, the test voltage signal is a continuously increasing time-variant voltage signal.

Preferably, the test voltage signal is a randomly varying piecewise linear voltage signal.

Preferably, the test voltage signal is a voltage signal with varying duty cycle.

Another objective of the present invention is to provide an automatic voltage-identifying power supply device. The automatic voltage-identifying power supply device has a control module, a voltage regulation circuit, a current load measuring circuit and a power supply circuit.

The voltage regulation circuit is electrically connected with the control module, is controlled by the control module and regulates an output voltage. The current load measures circuit electrically connected with the voltage regulation circuit and the control module, and is adapted to electrically connect with a post-stage power-receiving device for measuring a current fed back from the post-stage power-receiving device. The power supply circuit is adapted to electrically connect with a pre-stage power supply device, and is electrically connected with the control module to transmit an output power of the pre-stage power supply device to the control module. The control module controls the voltage regulation circuit to output a progressively increasing test voltage to the post-stage power-receiving device after the post-stage power-receiving device is electrically connected with the current load measuring circuit. The control module continuously receives a response current signal corresponding to the test voltage from the post-stage power-receiving device through the current load measuring circuit, and takes a stable test voltage as an operating voltage required by the post-stage power-receiving device when a variation of the response current signal or a power variation of the test voltage is stable.

Preferably, the automatic voltage-identifying power supply device further has an overload determination circuit for pre-stage power supply device electrically connected between the pre-stage power supply device and the control module, and receiving an output voltage from the pre-stage power supply device, so that the control module terminates a power outputted from the voltage regulation circuit to the post-stage power-receiving device.

Preferably, the current load measuring circuit has a load determination capacitor connected in parallel with the post-stage power-receiving device when the post-stage power-receiving device is connected with the automatic voltage-identifying power supply device, and the control module controls the voltage regulation circuit to output a signal with continuous pulses to the load determination capacitor and determines if the post-stage power-receiving device is connected with the automatic voltage-identify power supply device in accordance with a discharging speed of the load determination capacitor.

Preferably, the current load measuring circuit has two voltage divider circuits and a resistor electrically connected between the two voltage divider circuits, and voltage divider nodes of the two voltage divider circuits are electrically connected with the control circuit respectively.

Accordingly, the present invention has the following advantages:

Only one pre-stage power supply device having sufficient output power and wattage is required to supply power to electronic products with different voltage requirements.

Installation is simple and manual voltage setup is not required. The required voltage of the connected post-stage power-receiving device is automatically identified and supplied.

The pre-stage power supply device is protected from being burned out due to overloading when the output power of the pre-stage power supply device is not sufficient.

DETAILED DESCRIPTION OF THE INVENTION

Figure 1:
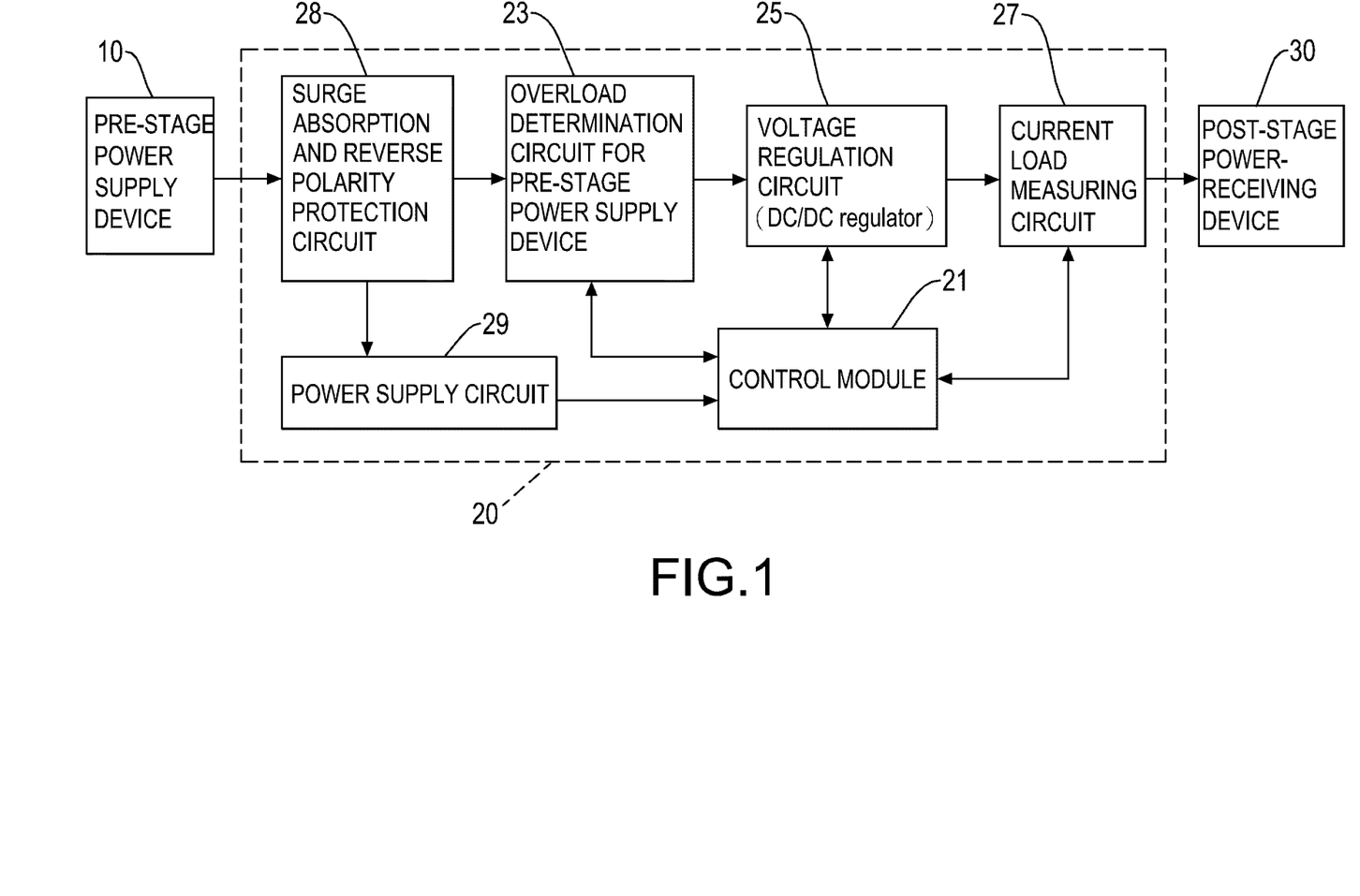
FIG. 1 is a block diagram of an automatic voltage-identifying power supply device in accordance with the present invention.

With reference to FIG. 1, an automatic voltage-identifying power supply device (20) in accordance with the present invention is serially connected between a pre-stage power supply device (10) and a post-stage power-receiving device (30). The automatic voltage-identifying power supply device (20) has a control module (21), an overload determination circuit for pre-stage power supply device (23), a voltage regulation circuit (25), a current load measuring circuit (27), a surge absorption and reverse polarity protection circuit (28) and a power supply circuit (29).

The pre-stage power supply device (10) may be a device capable of outputting power, such as an adapter, a solar panel, a wind power generator and the like.

The control module (21) is electrically connected with the overload determination circuit for pre-stage power supply device (23), the voltage regulation circuit (25), the current load measuring circuit (27), and a power supply circuit (29). An input terminal of the surge absorption and reverse polarity protection circuit (28) is electrically connected with the pre-stage power supply device (10). An output terminal of the current load measuring circuit (27) is electrically connected with the post-stage power-receiving device (30).

The surge absorption and reverse polarity protection circuit (28) receives the power outputted from the pre-stage power supply device (10) to determine if the polarity of the connection is reverse, and output power to the power supply circuit (29) after absorbing surge of power. Therefore, the power supply circuit (29) can further transmit power to the control module (21) to supply the required operating power.

The control module (21) is a micro-controller unit (MCU) chip executing an automatic voltage-identifying power supplying method to measure the required rated operating voltage of the post-stage power receiving device (30) through the current load measuring circuit (27) and to control the voltage regulation circuit (25) so as to generate an output voltage appropriate to the post-stage power-receiving device (30).

The control module (21) determines if a power outputted from the surge absorption and reverse polarity protection circuit (28) is sufficient to supply the power required by normal operation of the post-stage power-receiving device (30) through the overload determination circuit for pre-stage power supply device (23). If negative, an overload condition then appears. When determining the overload condition, the control module (21) disconnects the power outputted from the voltage regulation circuit (25) to the post-stage power-receiving device.

Figure 2:
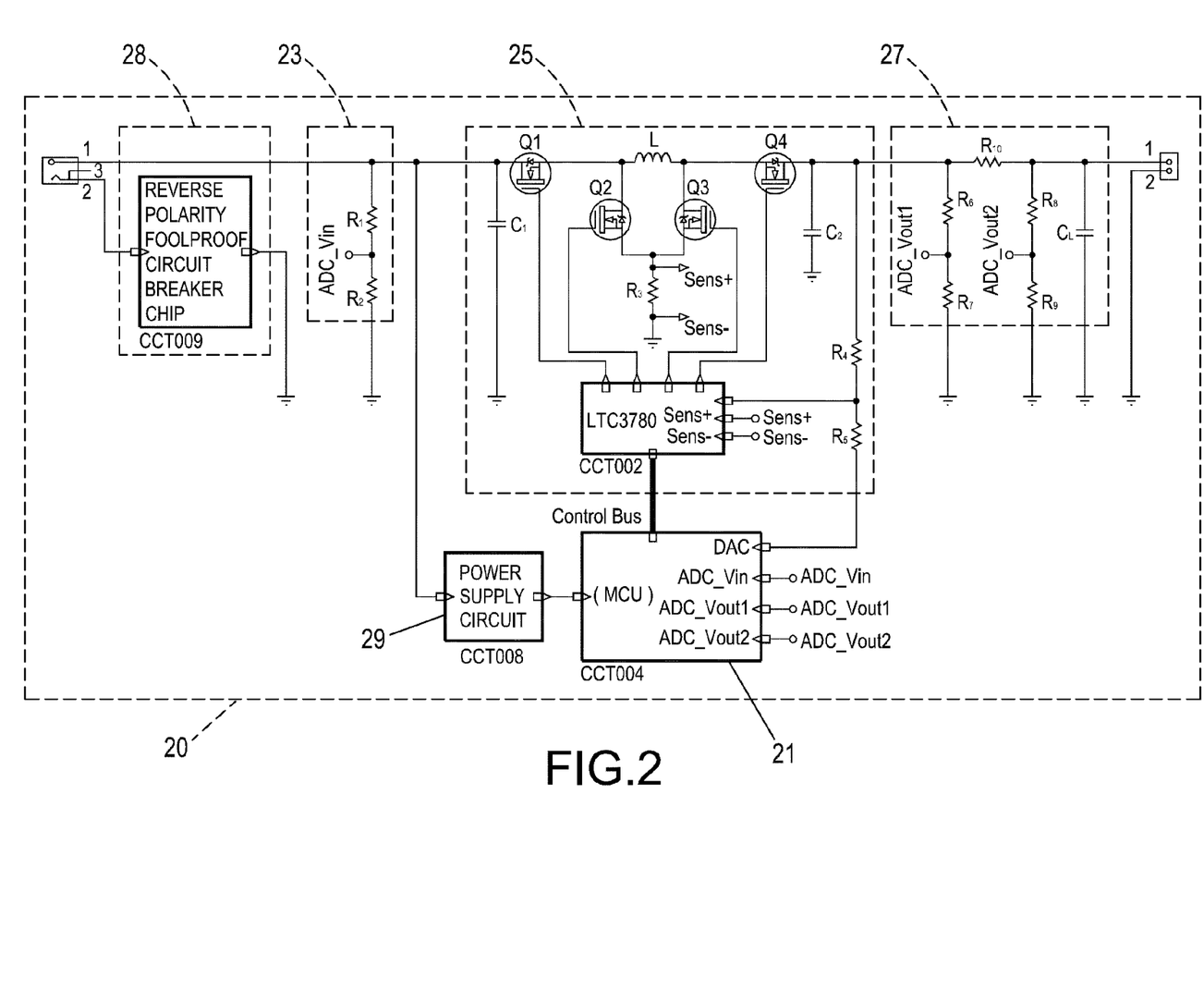
FIG. 2 is a circuit diagram of the automatic voltage-identifying power supply device in accordance with the present invention.

With reference to FIG. 2, the surge absorption and reverse polarity protection circuit (28) of the automatic voltage-identifying power supply device may be a reverse polarity foolproof circuit breaker chip, one composed of a MOS-Diode and a surge absorber, or simple components, such as a relay, a diode a surge absorber and the like, to achieve the purpose of reverse polarity protection and/or surge absorption. The overload determination circuit for pre-stage power supply device (23) may be a voltage divider circuit, a voltage sensing component, a comparison circuit, and so forth. The overload determination circuit for pre-stage power supply device (23) of the embodiment adopts the voltage divider circuit. A node of the voltage divider circuit is electrically connected with the control module (21). The voltage regulation circuit (25) may be a DC to DC regulation circuit or a DC to DC converter of any kind commanded by the control module (21) to regulate an output voltage of the overload determination circuit for pre-stage power supply device, which is a DC to DC voltage regulation circuit adopting a controller with a model number LTC3780 in the embodiment. The current load measuring circuit (27) may be a component or circuit, such as voltage division resistor, inductor circuit or current sensing chip and the like), for measuring and receiving current of the post-stage power-receiving device (30). In the embodiment, the current load measuring circuit (27) has a first voltage divider circuit and a second voltage divider circuit electrically connected with the control module (21). A constant resistor is further electrically connected between the first voltage divider circuit and the second voltage divider circuit. Nodes of the first and second voltage divider circuits are electrically connected with the control module (21) respectively. Therefore, the control module (21) can continuously read a voltage difference value of the two voltage divider circuits to obtain the voltage drop variation of the constant resistor, thereby constantly monitoring current of the post-stage power-receiving device (30).

Figure 3A:
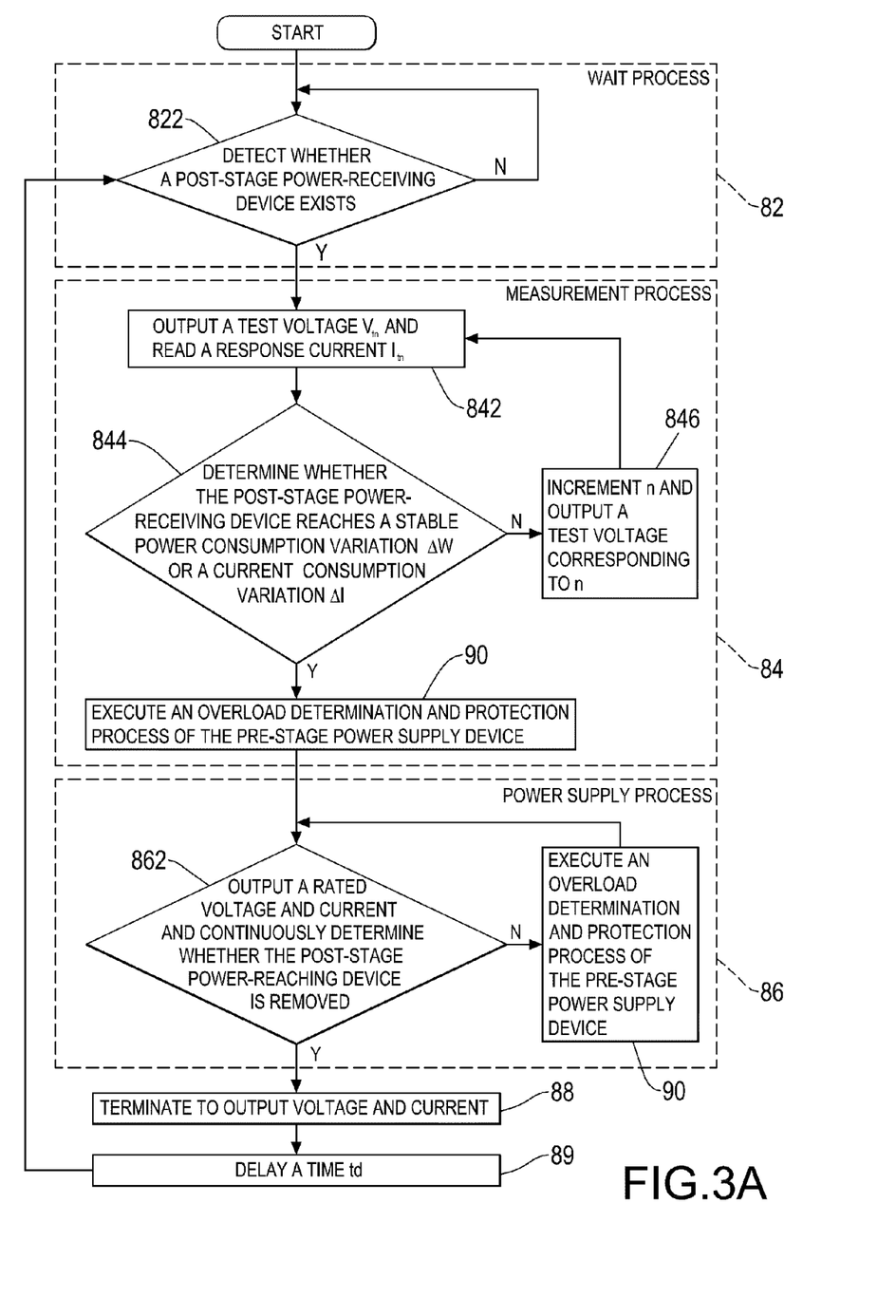
FIGS. 3A and 3B are a flow diagram of an automatic voltage-identifying power supplying method in accordance with the present invention.
Figure 3B:
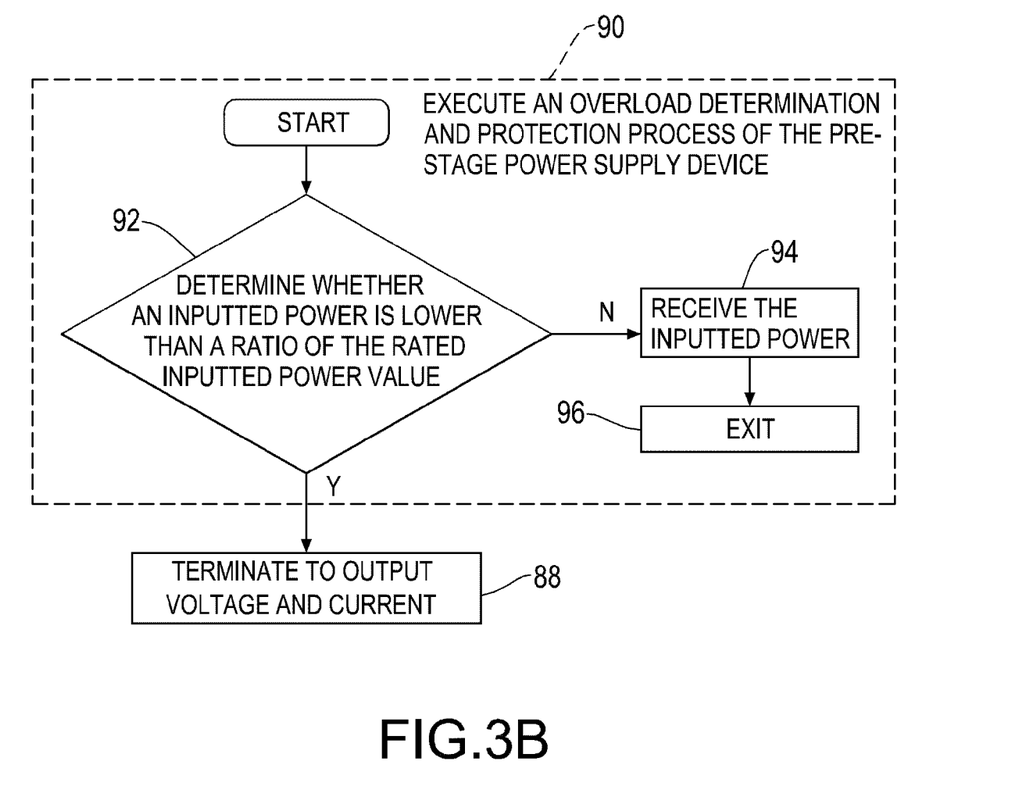

With reference to FIGS. 3A and 3B, an automatic voltage-identifying power supplying method has an wait process (82), a measurement process (84), a supplying power process (86), a step of terminating output of voltage and current (88), and a step of delaying a time td (89).

When the automatic voltage-identifying power supply device (20) is electrically connected with the pre-stage power supply device (10), the control module (21) obtains power to begin the wait process (82) continuously determining if the current load measuring circuit (27) is electrically connected with a post-stage power-receiving device (30). Hence, the wait process (82) at least has a step of detecting if the post-stage power-receiving device exists (822).

Figure 4:
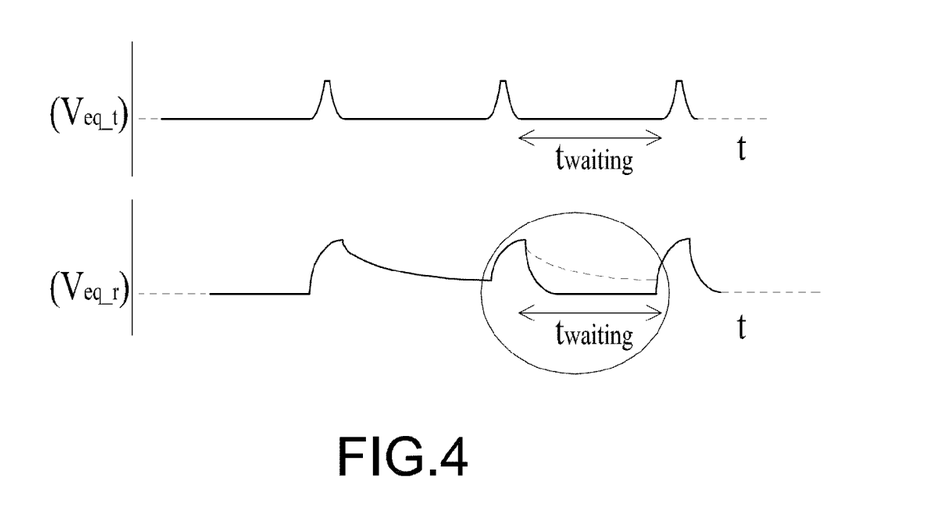
FIG. 4 is a waveform diagram of a test pulse voltage Veq_t and a response voltage signal Veq_r of the automatic voltage-identifying power supply device in accordance with the present invention.
Figure 4A:
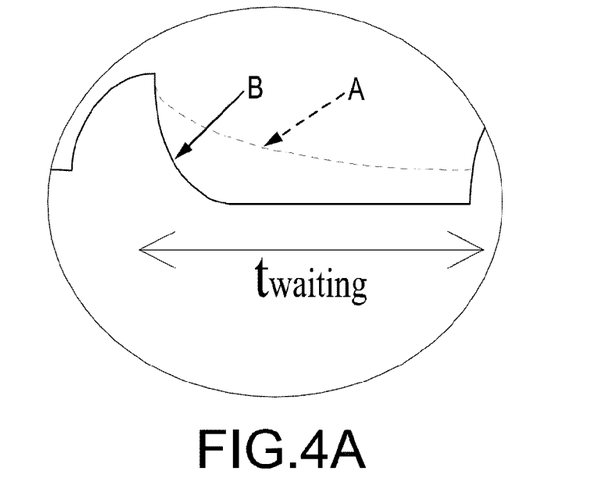
FIG. 4A is an enlarged waveform of a response voltage signal Veq_r in FIG. 4.

With reference to FIG. 4, when the control module (21) executes the step of detecting connection with power-receiving equipment (822), the control module (21) constantly outputs an equipment test pulse voltage (Veq_t) to a load determination capacitor connected in parallel with the post-stage power-receiving device (30). By determining a waveform of an equipment response voltage signal of the load determination capacitor, the control module (21) can determine if the automatic voltage-identifying power supply device (20) is electrically connected with the post-stage power-receiving device. The equipment test pulse voltage (Veq_t) is a continuous pulse voltage signal. Two neighboring pulse voltages are separated by a waiting time duration ($t_{waiting}$). When each equipment test pulse voltage is outputted to the load determination capacitor, the load determination capacitor receives a charging or discharging voltage of the equipment test pulse voltage (Veq_t) to generate the waveform of the equipment response voltage (Veq_r). The waveform of the equipment test pulse voltage (Veq_t) has three pulses. Assume that a post-stage power-receiving device (30) has been electrically connected with the automatic voltage-identifying power supply device (20) before the second pulse is outputted to the load determination capacitor. As the connected post-stage power-receiving device (30) obtains power from the automatic voltage-identifying power supply device (20) to perform its operation, the post-stage power-receiving device (30) extracts a part of current of a discharging cycle of the load determination capacitor before the automatic voltage-identifying power supply device (20) actually supplies power. As a result, the discharging speed of the load determination capacitor is relatively faster. For example, a curve A in FIG. 4A represents a normal discharging curve of the load determination capacitor without being connected with the post-stage power-receiving device. A curve B in FIG. 4A represents a discharging curve of the load determination capacitor connected with the post-stage power-receiving device. Hence, the control module (21) can determine if a post-stage power-receiving device (30) is connected with the automatic voltage-identifying power supply device (20) by reading a variation of a discharging curve of the load determination capacitor (for example, calculate if a difference value of the equipment response voltage (Veq_r) exceeds a predetermined value within a waiting time $t_{waiting}$ duration).

Furthermore, the load determination capacitor can be integrated in the current load measuring circuit (27). The capacitor marked by $C_L$ in FIG. 2 is an example.

The measurement process (84) has steps of outputting a test voltage signal $V_{tn}$, and reading a response current signal $I_{tn}$, (842); determining if the post-stage power-receiving device reaches a stable power consumption variation ($\Delta W$) or a stable current consumption variation ($\Delta I$); incrementing n and outputting a test voltage signal corresponding to n (846); and performing an overload determination and protection process of the pre-stage power supply device (90).

Figure 5:
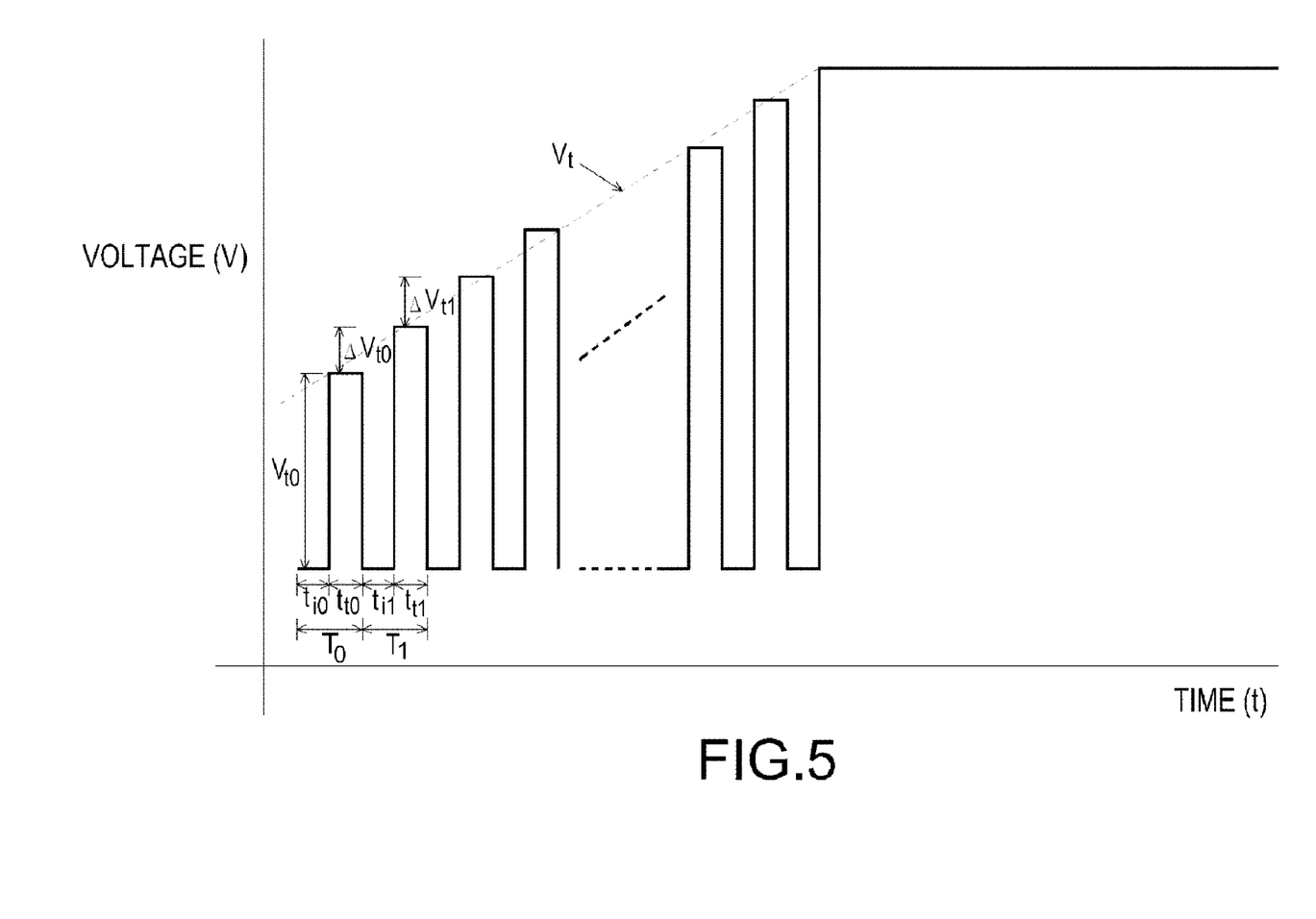
FIG. 5 is a waveform diagram of a test voltage signal $V_{tn}$, of the automatic voltage-identifying power supply device in accordance with the present invention.

In the step of outputting test voltage signal $V_{tn}$, and reading response current signal $I_{tn}$, (842), the control module (21) controls the voltage regulation circuit (25) to output a test voltage signal $V_{tn}$ to the post-stage power-receiving device (30). The test voltage signal $V_{tn}$ is a voltage signal depending on a setting sequence (for example, progressively increasing). With reference FIG. 5, The test voltage signal $V_{tn}$ may be a progressively increasing square-wave signal relative to time, or a continuously time-variant voltage signal that progressively increases relative to time as indicated by the segment marked by $V_r$. The control module (21) records each outputted test voltage signal ($V_{t0}, V_{t1}, V_{t2}, V_{t3} \ldots$). When applied to a post-stage power-receiving device (30) which is more sensitive to excessively high supplied voltage, the continuously time-variant voltage signal that progressively increases relative to time is adopted because the automatic voltage-identifying power supply device is not aware of the rated operating voltage required by the post-stage power-receiving device (30) when the post-stage power-receiving device (30) is initially connected with the automatic voltage-identifying power supply (20). Therefore, to prevent the test voltage signal $V_{tn}$ outputted to the post-stage power-receiving device (30) from exceeding its rated operating voltage, the test voltage signal $V_{tn}$ progressively increases. Moreover, after the test voltage signal $V_{tn}$ is supplied to the post-stage power-receiving device (30), the current load measuring circuit (27) measures the response current signal $I_{tn}$ after the post-stage power-receiving device (30) receives the test voltage signal $V_{tn}$. In addition to the sequentially varied voltage (for example, progressively increasing) configured according to time and application, voltage incrementing magnitude, incrementing method, time-variant variation and waveform of the test voltage signal $V_{tn}$ may all be altered on demand. Given the test voltage signal $V_{tn}$ in FIG. 5 as an example, the automatic voltage-identifying power supply device (20) periodically outputs a progressively increasing test voltage signal, and each cycle ($T_n$: $T_0, T_1, \ldots$) can be divided into a low voltage interval ($t_{in}$: $t_{i0}, t_{i1}, \ldots$) and a test voltage interval ($t_{tn}$: $t_{t0}, t_{t1} \ldots$). During a low voltage interval $t_{in}$, the test voltage signal is either a zero voltage or a low voltage. Being so is to supply voltage to certain post-stage power-receiving devices (30) requiring a reconfiguration process, or to prevent certain post-stage power-receiving devices (30) equipped with a voltage protection circuit from automatically locking as a result of incorrectly inputted voltage and rejecting to further receive any inputted voltage prior to a reconfiguration. Test voltage signals ($V_{tn}$: $V_{t0}, V_{t1}, \ldots$) that are relatively higher and progressively increase are present in the test voltage interval ($t_{in}$: $t_{i0}, t_{i1}, \ldots$). A voltage difference (for example, $\Delta V_{t0}$) of test voltages (for example, $V_{t0}, V_{t1}$) of two adjacent cycles $T_n$ may be constant or time-dependent variables (for example, increment equidistantly, decrement equidistantly, decrement exponentially, and so on). The ratio of the low voltage interval $t_{in}$ and $t_{tn}$, (i.e. duty cycle), may also be altered based on requirement (for example, $t_{tn}/t_{in}=10~100\%$). If the duty cycle is 100%, the test voltage signals are indicated by the $V_t$ segment as shown in FIG. 5. Varying the voltage difference and the duty cycle can adjust the time required to identify the rated operating voltage of the post-stage power-receiving device (30). Accordingly, vendors can implement automatic voltage-identifying power supply devices (20) having different performance in accordance with different requirement.

If the post-stage power-receiving device (30) that is less sensitive to supplied voltage is adopted, a voltage of the test voltage signal $V_{tn}$ may randomly vary or irregularly vary to acquire an outputted response current signal of the test voltage signal $V_{tn}$. As long as the control module (21) first records the test voltage signal $V_{tn}$ and the corresponding response current signal of each voltage point, the test voltage signal $V_{tn}$ and the corresponding response current signal can still be arranged in a progressively increasing order in the end. The aforementioned random or irregular variation (for example, piecewise linear variation, most common duty cycle variation) can effectively save the time in searching rated operating voltage under certain circumstances.

Figure 6:
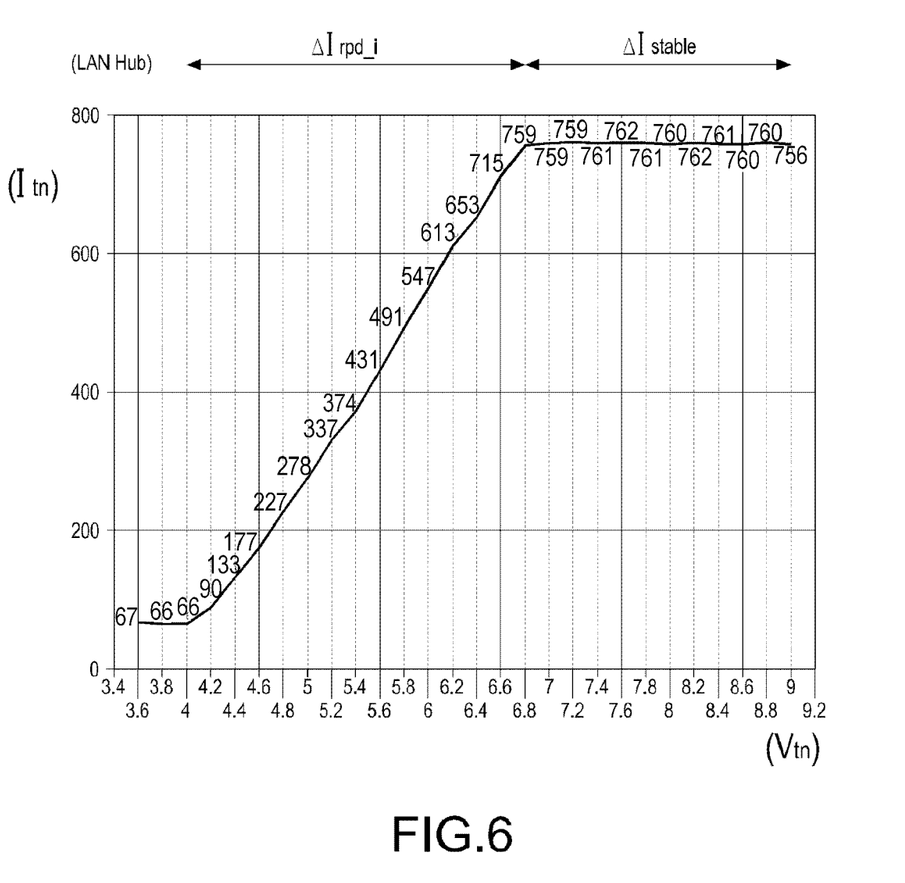
FIG. 6 is a data chart of a first measurement of the test voltage signal $V_{tn}$, and response current signal $I_{tn}$, of the automatic voltage-identifying power supply device in accordance with the present invention.
Figure 7:
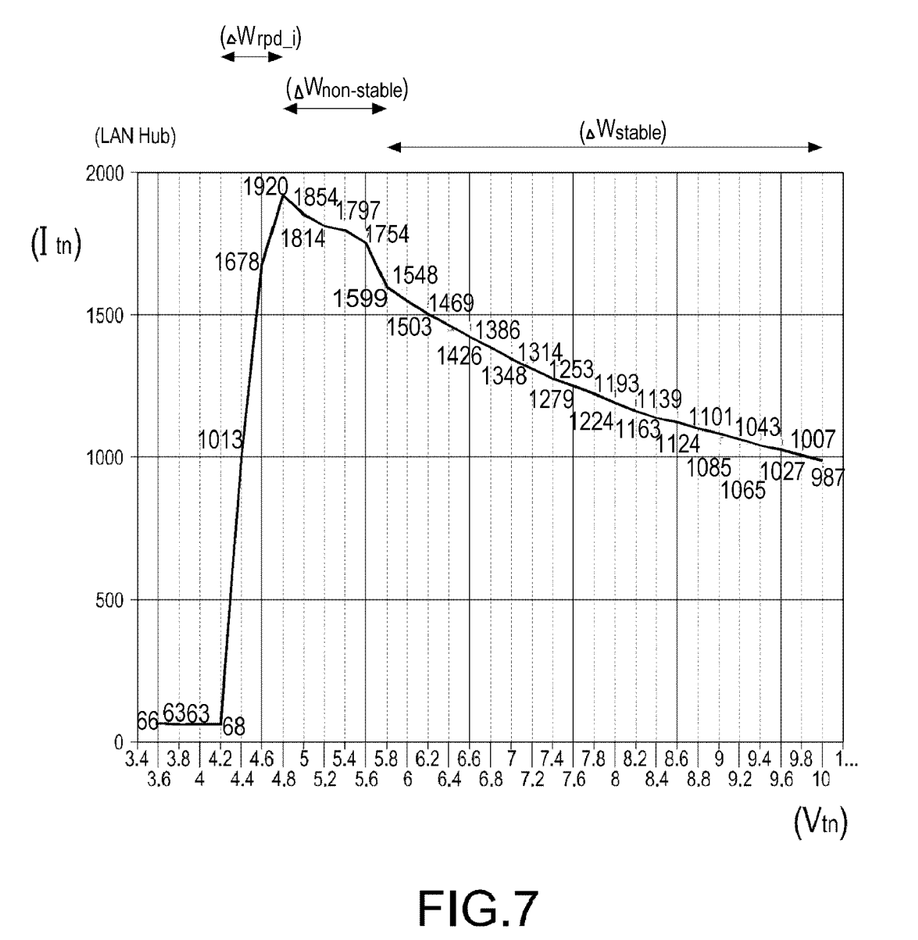
FIG. 7 is a data chart of a second measurement of the test voltage signal $V_{tn}$ and response current signal $I_{tn}$, of the automatic voltage-identifying power supply device in accordance with the present invention.

In the step of determining if the post-stage power-receiving device reaches a stable power consumption variation ($\Delta W$) or a stable current consumption variation ($\Delta I$) (844), the control module (21) determines if the post-stage power-receiving device (30) reach a stable power consumption variation ($\Delta W$) or a stable current consumption variation ($\Delta I$) by the measurement result of the current load measuring circuit (27). With reference to FIGS. 6 and 7, after performing the step of outputting test voltage signal $V_{tn}$, and reading response current signal $I_{tn}$ (842), from a VI curve of the test voltage signal $V_{tn}$, and the corresponding response current signal $I_{tn}$, the post-stage power-receiving device (30) will finally reach a stable current variation zone $\Delta I_{stable}$ or a stable power variation zone $\Delta W_{stable}$ regardless of what the internal power control component (for example, linear regulator, switching regulator and the like) is adopted while the test voltage signal $V_{tn}$ progressively increases. Before the stable current variation zone $\Delta I_{stable}$ or the stable power variation zone $\Delta W_{stable}$ is reached, a rapidly increasing zone appears in the beginning first ($\Delta I_{rpd\_i}$ and $\Delta W_{rpd\_i}$). The variation speed of the response current signal $I_{tn}$ is relatively faster in the initial rapidly ascending zone. To some post-stage power-receiving devices, a non-stable zone $\Delta W_{non-stable}$ may appear between the initial rapidly increasing zone ($\Delta I_{rpd\_i}$ and $\Delta W_{rpd\_i}$) and the stable current and power variation zones ($\Delta W_{stable}$ and $\Delta I_{stable}$).

When the stable current variation zone ($\Delta I_{stable}$) or the power variation zones ($\Delta W_{stable}$) is reached, it signals that the test voltage signal $V_{tn}$ has reached the rated operating voltage or the rated power of the post-stage power-receiving device (30). In other words, the consumed current variation ($\Delta I$) or the consumed power variation ($\Delta W$) is stable and approaches a constant (0, positive or negative constant) in the stable current variation zone ($\Delta I_{stable}$) or the power variation zones ($\Delta W_{stable}$).

When the consumed current variation ($\Delta I$) or the consumed power variation ($\Delta W$) is 0, it indicates that the consumed current approaches to a constant (as shown in the $\Delta I_{stable}$ zone of FIG. 6) or the consumed power approaches a constant (as shown in the $\Delta W_{stable}$ zone of FIG. 7). Given FIG. 6 as an example, in step 844, the control module (21) can identify a transition point of current variation of a VI curve according to variation of the consumed current $\Delta I$ in accordance with the VI curve, so as to identify the stable current variation zone $\Delta I_{stable}$. In fact, the consumed current variation $\Delta I$ in the stable current variation zone $\Delta I_{stable}$ is relatively lower.

Figure 8:
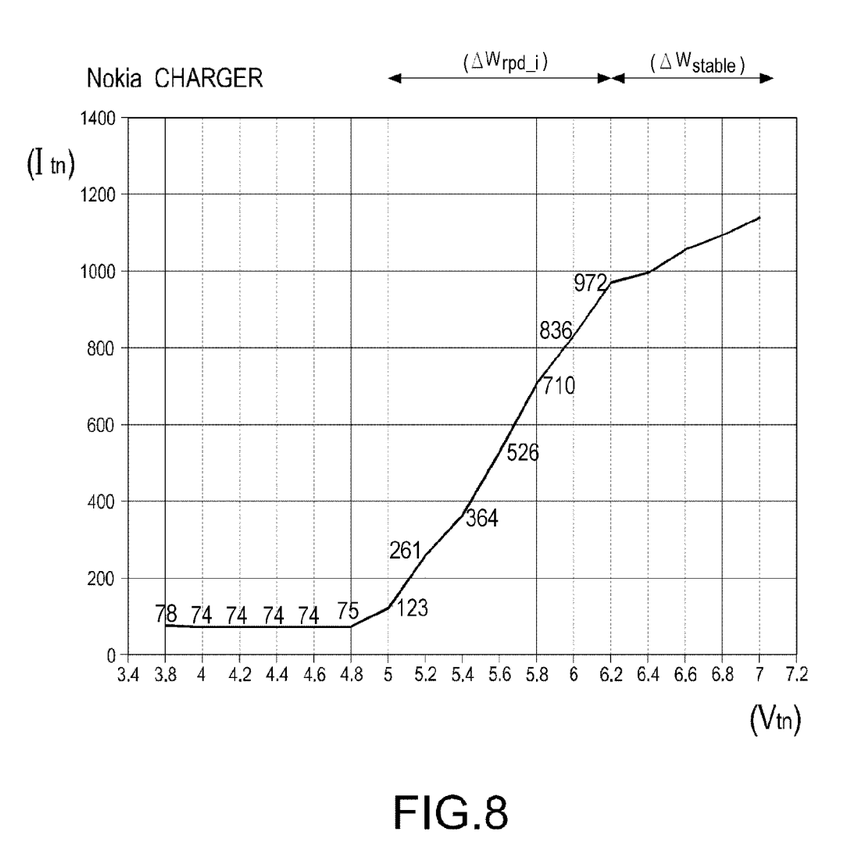
FIG. 8 is a data chart of a third measurement of the test voltage signal $V_{tn}$ and response current signal $I_{tn}$, of the automatic voltage-identifying power supply device in accordance with the present invention.

Hence, the control module (21) can determine if a stable zone is reached. With reference to FIG. 8, another possible consumed current variation $\Delta I$ greater than 0 is demonstrated.

Given FIG. 8 as an example, after the steeper rapidly increasing zone $\Delta W_{rpd\_I}$ in the beginning, the consumed current variation $\Delta I$ enters a zone of the response current signal $I_{tn}$, with a moderately increasing consumed current variation $\Delta I$ relatively. The consumed current variation $\Delta I$ is a relatively smaller positive value. In other words, when the test voltage signal $V_{tn}$ gradually increases, the consumed current also increases in an approximate ratio of equality. The control module (21) then determines if the main power-consuming component of the post-stage power-receiving device (30) is similar to a resistor type power-consuming component. In response to the gradually increasing voltage supplied after reaching a required supplied voltage, the consumed current gradually increases in a ratio of equality. If the control module (21) determines the response to be true, then perform the step of executing the overload determination and protection process of the pre-stage power supply device (90); otherwise, perform the step of incrementing n and outputting a test voltage signal corresponding to n (846).

In the step of incrementing n and outputting a test voltage signal corresponding to n (846), after the control module (21) outputs a test voltage signal $V_{tn}$ of next cycle (Tn, n=n+1) to the post-stage power-receiving device, keep performing the step of outputting test voltage signal $V_{tn}$ and reading response current signal $I_{tn}$ (842).

The supplying power process (86) has steps of outputting the rated voltage and current and continuously determining if the post-stage power-receiving device is removed (862), and executing the overload determination and protection process of the pre-stage power supply device (90). When the control module (21) executes the process (86), it means that the control module (21) has identified a rated operating voltage required by the post-stage power-receiving device (30) according to the foregoing steps. Consequently, the step of outputting the rated voltage and current and continuously determining if the post-stage power-receiving device is removed (862) is that the control module (21) constantly controls the voltage regulation circuit (25) to output the rated operating voltage to the post-stage power-receiving device (30) and constantly monitors to determine if the post-stage power-receiving device (30) is removed. Such constant monitoring may detect if the response current signal $I_{tn}$ of the post-stage power-receiving device is stable in a preset time (for example, every 200 ms) through the current load measuring circuit (27) during normal operation. If the response current signal $I_{tn}$ abruptly drops to approach 0, it means that the post-stage power-receiving device (30) is removed. Accordingly, the control module (21) can determine if the post-stage power-receiving device (30) is removed by virtue of variation of the response current signal $I_{tn}$. When the determination result is yes, perform the step of terminating output of voltage and current (88); otherwise, outputting the rated voltage and current and continuously determining if the post-stage power-receiving device is removed (862) after executing the overload determination and protection process of the pre-stage power supply device (90).

In the step of terminating output of voltage and current (88), the control module (21) instructs the voltage regulation circuit (25) to stop outputting voltage and current to the post-stage power-receiving device (30).

In the step of delaying a time td (89), the control module (21) returns to the wait process (82) after delaying a time td.

The step of executing the overload determination and protection process of the pre-stage power supply device (90)

further has steps of determining if an inputted power is lower than a specific ratio of the rated inputted power value (92), receiving the inputted power (94) and exiting (96).

The step of determining if an inputted power is lower than a specific ratio of the rated inputted power value (92) is that the control module (21) continuously acquires the voltage outputted from the pre-stage power supply device (10) and determines if the power is below a specific ratio of the rated output power. The so-called rated output power is a preset output voltage (for example, 20V, 30V and the like) and power of the pre-stage power supply device (10). Such step is to prevent the automatic power-identifying power supply device (20) from being connected to an abnormal pre-stage power supply device (10) whose rated output power insufficiently supports the power consumed by the post-stage power supply device. As a result, the pre-stage power supply device (10) burns out in the end due to overloading operation. When there is a post-stage power-receiving device (10) with excessively large operating voltage connected with the automatic voltage-identifying power supply device (20), the excessively large current outputted from the pre-stage power supply device (10) to the automatic voltage-identifying power supply device (20) lowers the rated output power for sake of the output power shortage of the pre-stage power supply device (10). If the determination result is yes, perform the step of terminating output of voltage and current (88); otherwise, exit (96) after receiving the inputted power (94). The step of receiving the inputted power (94) is that the automatic voltage-identifying power supply device (20) continuously receives power input from the pre-stage power supply device (10).

Besides, if the output voltage of the pre-stage power supply device (10) is not fixed, the control module (21) can also determine such condition by comparing the voltage output of the pre-stage power supply device (10) to see if the voltage output pertains to a normal state or an abnormal state. The normal state specifies a regular voltage output state of the pre-stage power supply device (10). For example, the voltage output of the pre-stage power supply device (10) may be a sinusoidal wave, the original normal state may be transformed to abnormal state due to enormous variation (abrupt change on sinusoidal wave) after connected with inappropriate post-stage power-receiving device (30), and the control module (21) can compare the difference between the normal state and the abnormal state to determine if the inputted power is below a specific ratio of the rated input power value.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An automatic voltage-identifying power supply method, comprising:
    a wait process determining if a post-stage power-receiving device exists, and going to a next step until the post-stage power-receiving device exists;
    a measurement process having
        a step of outputting a test voltage signal to the post-stage power-receiving device and continuously measuring a response current signal fed back from the post-stage power-receiving device; and
        a step of determining if the post-stage power-receiving device reaches a stable power consumption variation corresponding to the test voltage signal or a stable current consumption variation corresponding to the response current signal, wherein
            if the determination result is negative, continuously varies and outputs a test voltage signal to the post-stage power-receiving device, measures a corresponding response current signal and determines again if the post-stage power-receiving device reaches a stable power consumption variation or a stable current consumption variation; and
            if the determination result is positive, perform a next step;
    a supplying power process obtaining an input voltage signal from a pre-stage power supply device, letting the test voltage signal reaching a stable power consumption variation or a stable current consumption variation be a rated voltage to continuously output the rated voltage to the post-stage power-receiving device, continuously determining if the post-stage power-receiving device exists, and if the determination result is negative, continuously executing the step, and if the determination result is positive, executing a next step; and
    a step of terminating to output power to the post-stage power-receiving device and returning to the step of determining if the post-stage power-receiving device exists.

2. The automatic voltage-identifying power supply method as claimed in claim 1 further comprising an overload determination and protection process of the pre-stage power supply device performed after the determination result of the post-stage power-receiving device reaching a stable power consumption variation or a stable current consumption variation is positive and the determination result of the supplying power process is negative and having
    a step of determining if the outputted power by the pre-stage power supply device is below a ratio of a rated input power value of the pre-stage power supply device, wherein
        if the determination result is positive, terminate to output voltage and current from the pre-stage power supply device; and
        if the determination result is negative, continuously receive the output voltage of the pre-stage power supply device and then exit the overload determination and protection process of the pre-stage power supply device.

3. The automatic voltage-identifying power supply method as claimed in claim 2, wherein the test voltage signal is a series of square waves having progressively increasing voltage values.

4. The automatic voltage-identifying power supply method as claimed in claim 2, wherein the test voltage signal is a continuously increasing time-variant voltage signal.

5. The automatic voltage-identifying power supply method as claimed in claim 2, wherein the test voltage signal is a randomly varying piecewise linear voltage signal.

6. The automatic voltage-identifying power supply method as claimed in claim 2, wherein the test voltage signal is a voltage signal with varying duty cycle.

7. The automatic voltage-identifying power supply method as claimed in claim 1 further comprising a step of delaying a time executed after the step of terminating to output voltage and current and returning to the wait process after executing the step.

8. The automatic voltage-identifying power supply method as claimed in claim 7, wherein the test voltage signal is a series of square waves having progressively increasing voltage values.

9. The automatic voltage-identifying power supply method as claimed in claim 7, wherein the test voltage signal is a continuously increasing time-variant voltage signal.

10. The automatic voltage-identifying power supply method as claimed in claim 7, wherein the test voltage signal is a randomly varying piecewise linear voltage signal.

11. The automatic voltage-identifying power supply method as claimed in claim 3, wherein the test voltage signal is a voltage signal with varying duty cycle.

12. The automatic voltage-identifying power supply method as claimed in claim 1, wherein the test voltage signal is a series of square waves having progressively increasing voltage values.

13. The automatic voltage-identifying power supply method as claimed in claim 1, wherein the test voltage signal is a continuously increasing time-variant voltage signal.

14. The automatic voltage-identifying power supply method as claimed in claim 1, wherein the test voltage signal is a randomly varying piecewise linear voltage signal.

15. The automatic voltage-identifying power supply method as claimed in claim 1, wherein the test voltage signal is a voltage signal with varying duty cycle.

16. An automatic voltage-identifying power supply device, comprising:
   a control module;
   a voltage regulation circuit electrically connected with the control module, controlled by the control module and regulating an output voltage of the control module;
   a current load measuring circuit electrically connected with the voltage regulation circuit and the control module, and adapted to electrically connect with a post-stage power-receiving device for measuring a response current fed back from the post-stage power-receiving device; and
   a power supply circuit adapted to electrically connect with a pre-stage power supply device, and electrically connected with the control module to transmit an output power of the pre-stage power supply device to the control module;
   wherein the control module controls the voltage regulation circuit to vary and output a test voltage signal to the post-stage power-receiving device after the post-stage power-receiving device is electrically connected with the current load measuring circuit, and the control module continuously receives the response current signal corresponding to the test voltage signal from the post-stage power-receiving device through the current load measuring circuit, and takes a stable test voltage signal as an operating voltage required by the post-stage power-receiving device when a variation of the response current signal or a power variation of the test voltage signal is stable.

17. The automatic voltage-identifying power supply device as claimed in claim 16 further comprising:
   an overload determination circuit for pre-stage power supply device electrically connected between the pre-stage power supply device and the control module, and receiving an output voltage from the pre-stage power supply device, so that the control module terminates a power outputted from the voltage regulation circuit to the post-stage power-receiving device.

18. The automatic voltage-identifying power supply device as claimed in claim 17, wherein the current load measuring circuit comprises a load determination capacitor connected in parallel with the post-stage power-receiving device when the post-stage power-receiving device is connected with the automatic voltage-identifying power supply device, and the control module controls the voltage regulation circuit to output a signal with continuous pulses to the load determination capacitor and determines if the post-stage power-receiving device is connected with the automatic voltage-identify power supply device in accordance with a discharging speed of the load determination capacitor.

19. The automatic voltage-identifying power supply device as claimed in claim 18, wherein the current load measuring circuit has two voltage divider circuits and a resistor electrically connected between the two voltage divider circuits, and voltage divider nodes of the two voltage divider circuits are electrically connected with the control circuit respectively.

20. The automatic voltage-identifying power supply device as claimed in claim 17 further comprising:
   a surge absorption and reverse polarity protection circuit electrically connected between the pre-stage power supply device and the power supply circuit and electrically connected with the overload determination circuit for pre-stage power supply device.

21. The automatic voltage-identifying power supply device as claimed in claim 20, wherein
   the current load sensing circuit has two voltage divider circuits electrically connected with the control module and a resistor electrically connected between the two voltage divider circuits; and
   the overload determination circuit for pre-stage power supply device is a voltage divider circuit and a voltage divider node is electrically connected with the control module.

22. The automatic voltage-identifying power supply device as claimed in claim 16, wherein the current load measuring circuit comprises a load determination capacitor connected in parallel with the post-stage power-receiving device when the post-stage power-receiving device is connected with the automatic voltage-identifying power supply device, and the control module controls the voltage regulation circuit to output a signal with continuous pulses to the load determination capacitor and determines if the post-stage power-receiving device is connected with the automatic voltage-identify power supply device in accordance with a discharging speed of the load determination capacitor.

23. The automatic voltage-identifying power supply device as claimed in claim 22, wherein the current load measuring circuit has two voltage divider circuits and a resistor electrically connected between the two voltage divider circuits, and voltage divider nodes of the two voltage divider circuits are electrically connected with the control circuit respectively.

24. The automatic voltage-identifying power supply device as claimed in claim 16, wherein the control module controls the voltage regulation circuit to output a progressively increasing test voltage signal to the post-stage power-receiving device after the post-stage power-receiving device is electrically connected with the current load measuring circuit.

* * * * *